United States Patent
Kamata

(10) Patent No.: US 11,835,879 B2
(45) Date of Patent: Dec. 5, 2023

(54) EXPOSURE HEAD AND IMAGE FORMING APPARATUS

(71) Applicant: CANON KABUSHIKI KAISHA, Tokyo (JP)

(72) Inventor: Yusuke Kamata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 3 days.

(21) Appl. No.: 17/674,114

(22) Filed: Feb. 17, 2022

(65) Prior Publication Data
US 2022/0171307 A1    Jun. 2, 2022

Related U.S. Application Data

(63) Continuation of application No. PCT/JP2020/031195, filed on Aug. 19, 2020.

(30) Foreign Application Priority Data

Aug. 23, 2019  (JP) ................. 2019-152947

(51) Int. Cl.
  *G03G 15/04*  (2006.01)
  *H01L 25/075*  (2006.01)
  *H01L 33/62*  (2010.01)

(52) U.S. Cl.
  CPC . *G03G 15/04036* (2013.01); *G03G 15/04063* (2013.01); *H01L 25/0753* (2013.01); *G03G 15/04054* (2013.01); *H01L 33/62* (2013.01)

(58) Field of Classification Search
  CPC ....... G03G 15/04036; G03G 15/04063; G03G 15/04054; H01L 25/0753; H01L 33/62; H04N 1/036
  See application file for complete search history.

(56) References Cited

U.S. PATENT DOCUMENTS

2005/0035358 A1    2/2005   Chung et al.

FOREIGN PATENT DOCUMENTS

| JP | H02-210876 A | 8/1990 |
|---|---|---|
| JP | H04-62998 A | 2/1992 |

(Continued)

OTHER PUBLICATIONS

English machine translation of Suzuki et al. (JP 2015189037 A) (Year: 2015).*

(Continued)

*Primary Examiner* — Walter L Lindsay, Jr.
*Assistant Examiner* — Geoffrey T Evans
(74) *Attorney, Agent, or Firm* — VENABLE LLP

(57) ABSTRACT

An exposure head includes a plurality of light emitting element array chips each having light emitting portions and a wire bonding pad. The plurality of light emitting element array chips are arranged in a staggered manner in a longitudinal direction of a printed-circuit board. One end portion of a first light emitting element array chip overlaps one end portion of a second light emitting element array chip when viewed in a width direction. Another end portion of the second light emitting element array chip overlaps one end portion of a third light emitting element array chip when viewed in the width direction. An adhesive for fixing the second light emitting element array chip to the printed-circuit board is applied in an area between the one end portion of the first light emitting element array chip and the one end portion of the third light emitting element array chip.

11 Claims, 5 Drawing Sheets

(56) References Cited

FOREIGN PATENT DOCUMENTS

| | | | |
|---|---|---|---|
| JP | 2003-103826 A | | 4/2003 |
| JP | 2007294876 A | * | 11/2007 |
| JP | 2011-131475 A | | 7/2011 |
| JP | 2014-22156 A | | 2/2014 |
| JP | 2015-189036 A | | 11/2015 |
| JP | 2015189037 A | * | 11/2015 |
| JP | 2017-183436 A | | 10/2017 |
| JP | 2019-59090 A | | 4/2019 |

OTHER PUBLICATIONS

English machine translation of Kinoshita et al. (JP 2007294876 A) (Year: 2007).*
International Search Report dated Sep. 14, 2020 in corresponding PCT Application No. PCT/JP2020/031195 (English translation included).
PCT International Preliminary Report on Patentability and Written Opinion of the International Searching Authority issued in International Application No. PCT/JP2020/031195 dated Feb. 17, 2022 (English Translation Included).
Japanese Office Action dated May 23, 2023, in corresponding Japanese Application No. 2019-152947 (English translation included).

* cited by examiner

EXPOSURE HEAD AND IMAGE FORMING APPARATUS

CROSS-REFERENCE TO RELATED APPLICATIONS

This application is a Continuation of International Patent Application No. PCT/JP2020/031195, filed Aug. 19, 2020, which claims the benefit of Japanese Patent Application No. 2019-152947, filed Aug. 23, 2019, both of which are hereby incorporated by reference herein in their entirety.

BACKGROUND OF THE INVENTION

Field of the Invention

The present invention relates to an exposure head and an image forming apparatus.

Description of the Related Art

In an electrophotographic printer, there has been generally known a method of exposing a photosensitive drum through use of an exposure head using, for example, an LED (light emission diode) or an organic electroluminescence (organic EL) to form a latent image. The exposure head includes a light emitting element array arrayed in a longitudinal direction of the photosensitive drum, and a rod lens array that forms an image of light of the light emitting element array on the photosensitive drum. As the LED or the organic EL, there has been known a configuration of having a surface emitting shape (hereinafter referred to as "surface emitting element array") in which a radiation direction of light from a light emitting surface is the same as a direction of an optical axis of the rod lens array. Here, a length of the light emitting element array is determined in accordance with a width of an image forming area on the photosensitive drum. An element interval between light emitting elements is determined in accordance with a resolution of a printer. For example, in a case of a printer of 1,200 dpi (dots per inch), the interval between the pixels is 21.16 μm (truncated to 2 decimal places), and hence the element interval is also 21.16 μm (micrometers). In the printer using the exposure head as described above, the number of components to be used is smaller than that of a printer of a laser scanning type in which a laser beam is deflected by a rotary polygon mirror, thereby being capable of easily reducing the size and cost of the device. As the exposure head described above, there has been proposed an exposure head in which a plurality of light emitting chips each having a light emitting element array formed on a compound semiconductor substrate are arranged on a printed-circuit board (Japanese Patent Application Laid-Open No. 2017-183436).

In Japanese Patent Application Laid-Open No. 2017-183436, there is disclosed an example in which a compound semiconductor substrate having a light emitting element array formed thereon as the light emitting chip is used. The light emitting chip has an elongated strip shape, and includes wire bonding pads on both sides of the light emitting element array. When the light emitting elements are arranged in line, there is no light emitting element at a portion of the wire bonding pad. Thus, the light emitting chips are arranged in a staggered manner such that parts of the light emitting chips overlap each other in a direction orthogonal to the longitudinal direction so that the light emitting elements are not interrupted in the longitudinal direction. The light emitting chips are fixed to the printed-circuit board via an adhesive. When an amount of the adhesive is large in a portion in which parts of the light emitting chips overlap each other in the direction orthogonal to the longitudinal direction, there is a problem in that the interval between the light emitting chips in the direction orthogonal to the longitudinal direction becomes larger than a desired interval due to disturbance by the adhesive. In some cases, conversely, there is a problem in that the light emitting chips are attracted to each other due to surface tension of the adhesive so that the interval becomes smaller than the desired interval. Further, when the interval between the light emitting chips is small, there is also a problem in that the adhesive creeps up due to a capillary phenomenon to contaminate surfaces of the light emitting chips. Further, conversely, when the amount of the adhesive is small, and there is no sufficient adhesive below the wire bonding pad, there is a problem in that chips are broken due to an impact at the time of wire bonding, or wire bonding strength is insufficient. As described above, when setting of an application range of the adhesive or an application amount of the adhesive is not appropriate, there is a problem in that various quality problems occur.

SUMMARY OF THE INVENTION

According to an embodiment of the present invention, there is provided an exposure head, comprising: a printed-circuit board; a plurality of light emitting element array chips; and an adhesive for fixing the plurality of light emitting element array chips to the printed-circuit board, wherein each of the plurality of light emitting element array chips includes a plurality of light emitting portions and a wire bonding pad, wherein the plurality of light emitting element array chips are arranged in a staggered manner in a longitudinal direction of the printed-circuit board, wherein one end portion of a first light emitting element array chip among the plurality of light emitting element array chips overlaps one end portion of a second light emitting element array chip adjacent to the first light emitting element array chip when viewed in a width direction orthogonal to the longitudinal direction, and another end portion of the second light emitting element array chip overlaps one end portion of a third light emitting element array chip adjacent to the second light emitting element array chip when viewed in the width direction, and wherein the adhesive for fixing the second light emitting element array chip to the printed-circuit board is applied in an area between the one end portion of the first light emitting element array chip and the one end portion of the third light emitting element array chip.

Further features of the present invention will become apparent from the following description of exemplary embodiments with reference to the attached drawings.

DESCRIPTION OF THE EMBODIMENTS (Image Forming Apparatus)

Figure 1:
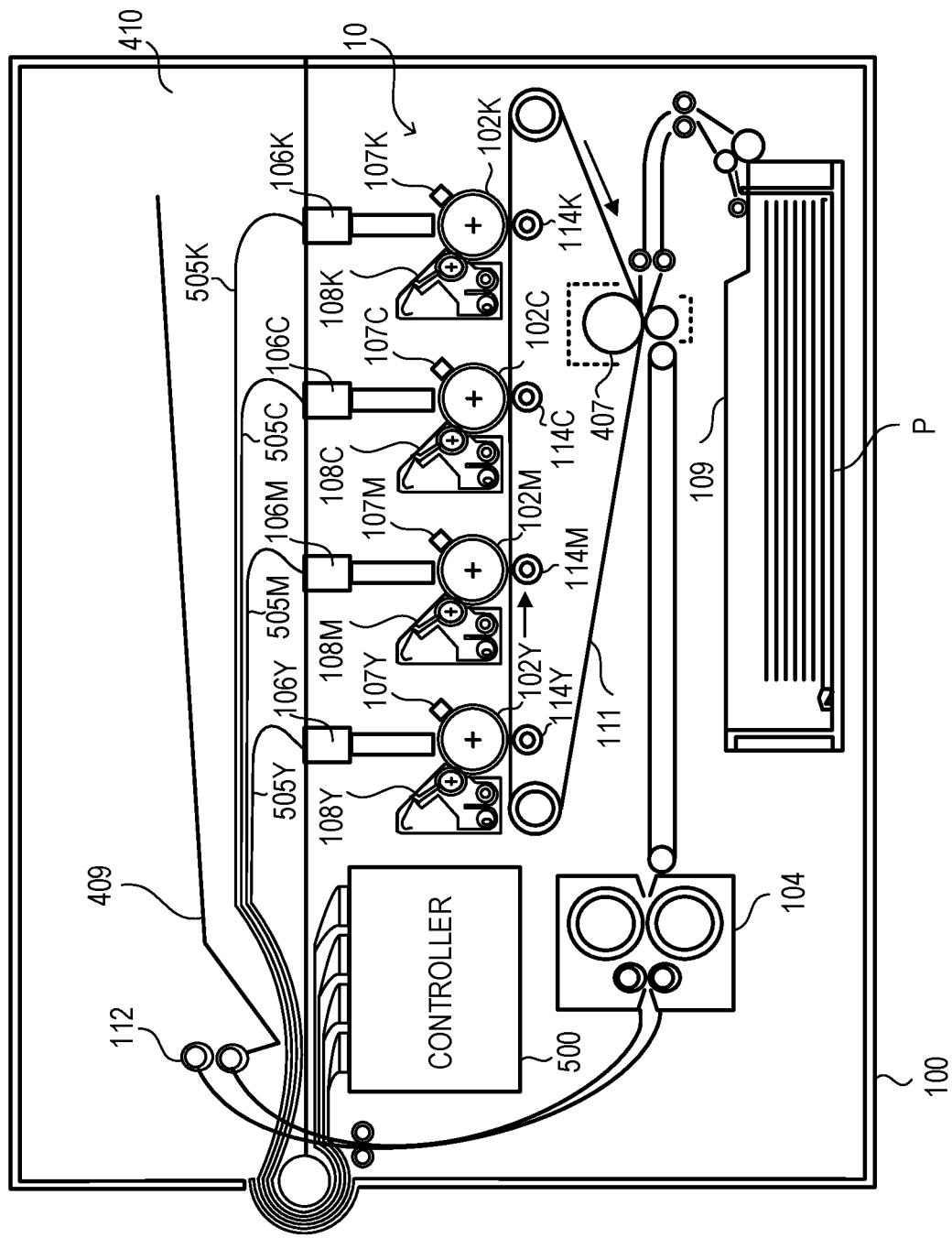
FIG. 1 is a sectional view of an image forming apparatus.

With reference to FIG. 1, an electrophotographic image forming apparatus 1 of the embodiment is described. FIG. 1 is a sectional view of the image forming apparatus 1. The image forming apparatus 1 includes a main body 100 and an upper frame portion 410. In the main body 100 of the image forming apparatus 1, an image forming portion 10 is provided. The image forming portion 10 rotates photosensitive drums 102Y, 102M, 102C, and 102K. Chargers 107Y, 107M, 107C, and 107K uniformly charge surfaces of the photosensitive drums 102Y, 102M, 102C, and 102K, respectively. Light emission of exposure heads 106Y, 106M, 106C, and 106K is controlled in accordance with a drive signal (image signal) supplied by a controller 500 via electronic transmission members 505Y, 505M, 505C, and 505K. With this, the exposure heads 106Y, 106M, 106C, and 106K expose the uniformly charged surfaces of the photosensitive drums 102Y, 102M, 102C, and 102K with light, respectively, to form electrostatic latent images.

Developing devices 108Y, 108M, 108C, and 108K develop the electrostatic latent images formed on the photosensitive drums 102Y, 102M, 102C, and 102K with toner to form toner images. The developed toner images of yellow, magenta, cyan, and black are sequentially transferred onto a transfer belt 111 by primary transfer devices 114Y, 114M, 114C, and 114K, respectively, and are superimposed on each other. The toner images transferred onto the transfer belt 111 are transferred onto a recording medium P, which is conveyed from a feed cassette 109, by a secondary transfer device 407. The toner images on the recording medium P are pressurized and heated by a fixing device 104 to be fixed to the recording medium P, thereby forming a full-color image on the recording medium P. The recording medium P having the image formed thereon is delivered to a delivery portion 409 by delivery rollers 112.

(Exposure Head)

Figure 2A:
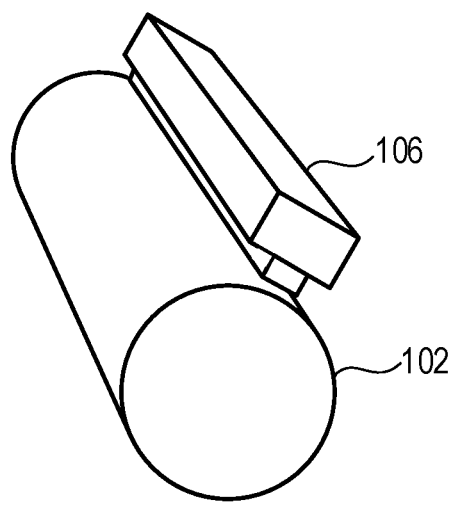
FIG. 2A is a view for illustrating arrangement of an exposure head with respect to a photosensitive drum.
Figure 2B:
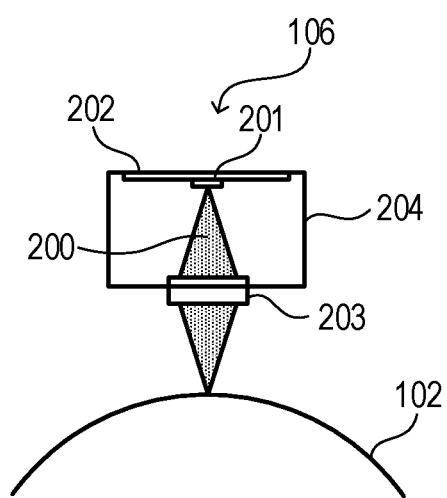
FIG. 2B is a view for illustrating a light flux emitted from a light emitting element group to be collected onto the photosensitive drum by a rod lens array.

Next, with reference to FIG. 2A and FIG. 2B, the exposure head 106 for exposing the photosensitive drum 102 with light is described. FIG. 2A and FIG. 2B are views for illustrating the arrangement of the photosensitive drum 102 and the exposure head 106. FIG. 2A is a view for illustrating the arrangement of the exposure head 106 with respect to the photosensitive drum 102. FIG. 2B is a view for illustrating a light flux 200 emitted from a light emitting element group 201 to be collected onto the photosensitive drum 102 by a rod lens array 203. The exposure head 106 and the photosensitive drum 102 are mounted to the main body 100 of the image forming apparatus 1 by a mounting member (not shown). The exposure head 106 includes the light emitting element group 201, a printed-circuit board 202 having the light emitting element group 201 mounted thereon, the rod lens array 203, and a housing 204 to which the rod lens array 203 and the printed-circuit board 202 are mounted. At the factory, work of assembling and adjusting the exposure head 106 alone is performed. In the assembling and adjusting work, there are performed light amount adjustment and focus adjustment for adjusting a spot formed at a light collecting position to a predetermined size. In this case, the rod lens array 203 is arranged so that a distance between the photosensitive drum 102 and the rod lens array 203 and a distance between the rod lens array 203 and the light emitting element group 201 are predetermined distances. In this manner, the light flux 200 emitted from the light emitting element group 201 is imaged onto the photosensitive drum 102 by the rod lens array 203. In the focus adjustment, the position to mount the rod lens array 203 is adjusted so that the distance between the rod lens array 203 and the light emitting element group 201 takes a predetermined value. Further, in the light amount adjustment, light emitting portions of the light emitting element group 201 are individually caused to sequentially emit light, and a drive current for controlling light emitted from the light emitting portions is adjusted so that the light amount of light collected by the rod lens array 203 takes a predetermined value.

(Printed-Circuit Board)

Figure 3A:
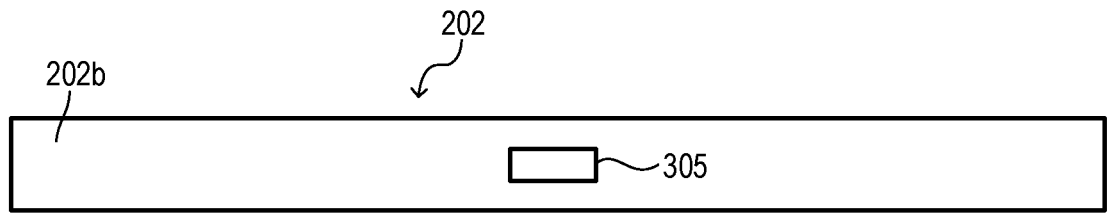
FIG. 3A is a view for illustrating a light emitting element non-mounting surface of a printed-circuit board.
Figure 3B:
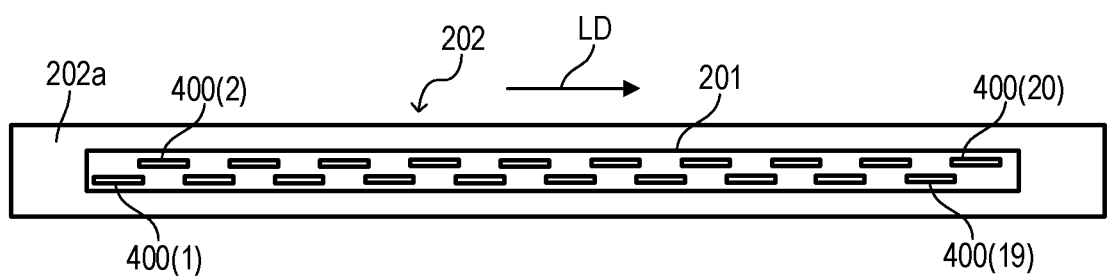
FIG. 3B is a view for illustrating a light emitting element mounting surface of the printed-circuit board.
Figure 3C:
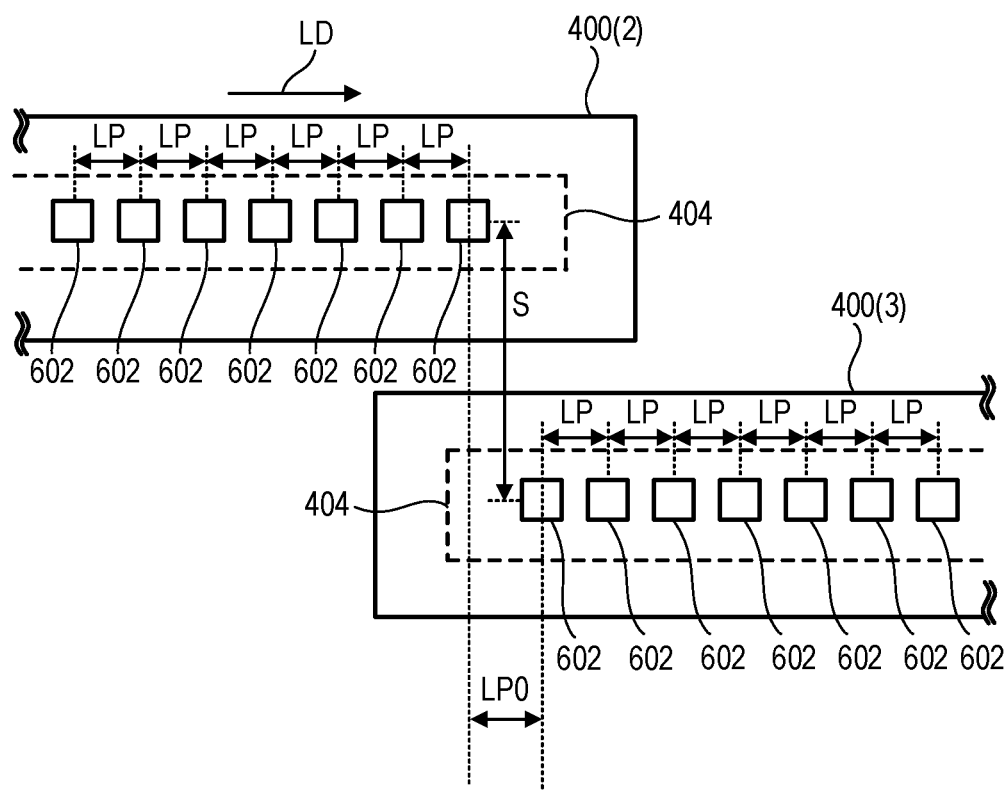
FIG. 3C is a view for illustrating a boundary portion between light emitting element array chips.

Next, with reference to FIG. 3A, FIG. 3B, and FIG. 3C, the printed-circuit board 202 having the light emitting element group 201 mounted thereon is described. FIG. 3A, FIG. 3B, and FIG. 3C are views for illustrating the printed-circuit board 202. The printed-circuit board 202 has a surface 202a on which the light emitting element group 201 is mounted (hereinafter referred to as "light emitting element mounting surface"), and a surface 202b opposite to the light emitting element mounting surface 202a (hereinafter referred to as "light emitting element non-mounting surface"). FIG. 3A is a view for illustrating the light emitting element non-mounting surface 202b of the printed-circuit board 202. A connector 305 is arranged on the light emitting element non-mounting surface 202b. The connector 305 is connected to a control signal cable from the controller 500 and a power cable from a power supply (not shown). FIG. 3B is a view for illustrating the light emitting element mounting surface 202a of the printed-circuit board 202. The light emitting element group 201 is formed of 20 light emitting element array chips 400(1), 400(2), . . . , 400(19), and 400(20) arranged alternately, that is, in a staggered manner. The light emitting element array chips 400(1) to 400(20) receive, as an input, a control signal from the controller 500 via the connector 305, and are supplied with power from the power supply (not shown) to be driven.

FIG. 3C is a view for illustrating a boundary portion between the light emitting element array chip 400(2) and the light emitting element array chip 400(3). In a light emitting area 404 of each of the light emitting element array chips 400(1) to 400(20), light emitting portions 602 being 748 light emitting points are formed at predetermined pitches LP in a longitudinal direction LD of the light emitting element array chip 400. The light emitting portion 602 may be a surface emitting element such as a surface emitting laser. In the embodiment, the predetermined pitch LP of the light emitting portions 602 adjacent to each other in the longitudinal direction LD is a pitch (approximately 21.16 μm) at a resolution of 1,200 dpi. An end-to-end distance of the 748 light emitting portions 602 in the light emitting area 404 of the light emitting element array chip 400 is about 15.8 mm. The light emitting element group 201 includes 20 light emitting element array chips 400, and thus includes 14,960 light emitting portions 602. Thus, an image having a width of about 316 mm can be formed. The light emitting element array chips 400(1) to 400(20) are arranged in two rows in a staggered manner. The light emitting element array chips 400(1) to 400(20) are arranged along the longitudinal direction LD of the printed-circuit board 202.

As illustrated in FIG. 3C, even at the boundary portion between the light emitting element array chips 400 (between the chips), a pitch LP0 between the light emitting portions 602 in the longitudinal direction LD is also a pitch (approximately 21.16 μm) at the resolution of 1,200 dpi (LP0=LP). Further, the light emitting element array chips 400 are arranged so that an interval S between the light emitting portions 602 of the light emitting element array chips 400 in the two rows is about 105 μm (interval corresponding to five pixels at 1,200 dpi and interval corresponding to ten pixels at 2,400 dpi).

(Light Emitting Element Array Chip)

Figure 4:
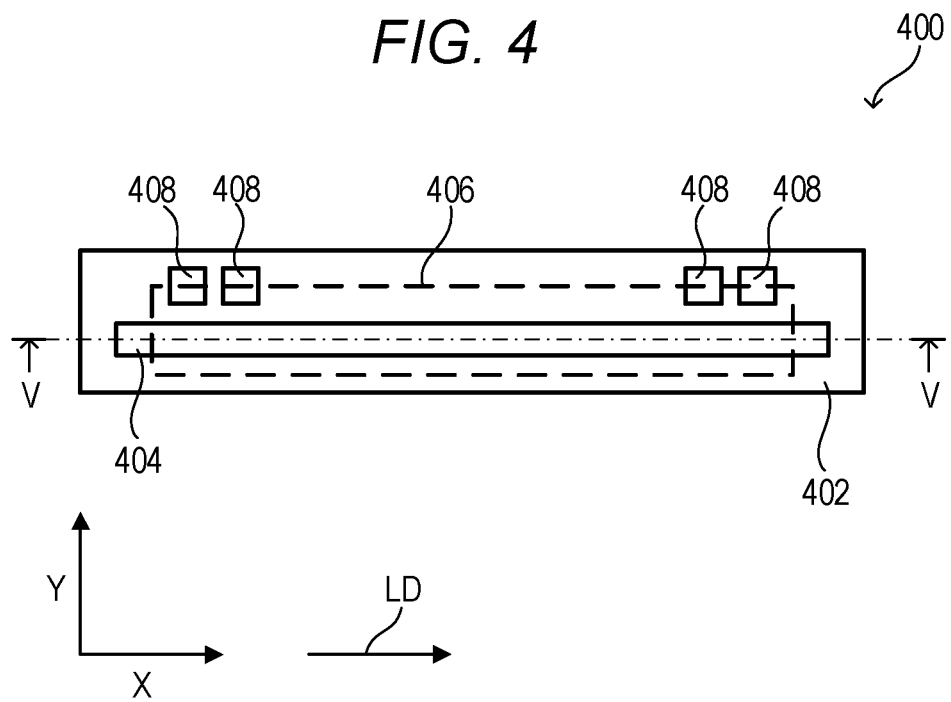
FIG. 4 is a plan view of the light emitting element array chip.

Next, with reference to FIG. 4, the light emitting element array chip 400 is described. FIG. 4 is a plan view of the light emitting element array chip 400. The light emitting element array chip 400 includes a light emitting circuit board 402, the light emitting area 404, and a plurality of wire bonding pads (WB pads) 408. The light emitting area 404 includes the plurality of light emitting portions 602 on the light emitting circuit board 402. The plurality of wire bonding pads (WB pads) 408 are formed on the light emitting circuit board 402. The wire bonding pads 408 are electrically connected to the printed-circuit board 202 by metal wires. The light emitting circuit board 402 incorporates a circuit portion 406 serving as a control circuit for controlling the drive of the light emitting area 404. As the circuit portion 406, an analog drive circuit, a digital control circuit, or a circuit including both of those circuits can be used. The supply of power to the circuit portion 406 and the input/output of a signal to/from the outside of the light emitting element array chip 400 are performed through the wire bonding pads 408. As the light emitting circuit board 402, a silicon (hereinafter referred to as "Si") circuit board can be used. Regarding the Si circuit board, a process technology for forming an integrated circuit has been developed. The Si circuit board has already been used as circuit boards of various integrated circuits, and hence a high-speed and high-performance circuit can be formed at high density in the Si circuit board. In addition, large-diameter silicon wafers have been widely used, and hence there is an advantage in that the Si circuit board can be obtained at low cost.

(Light Emitting Area)

Figure 5:
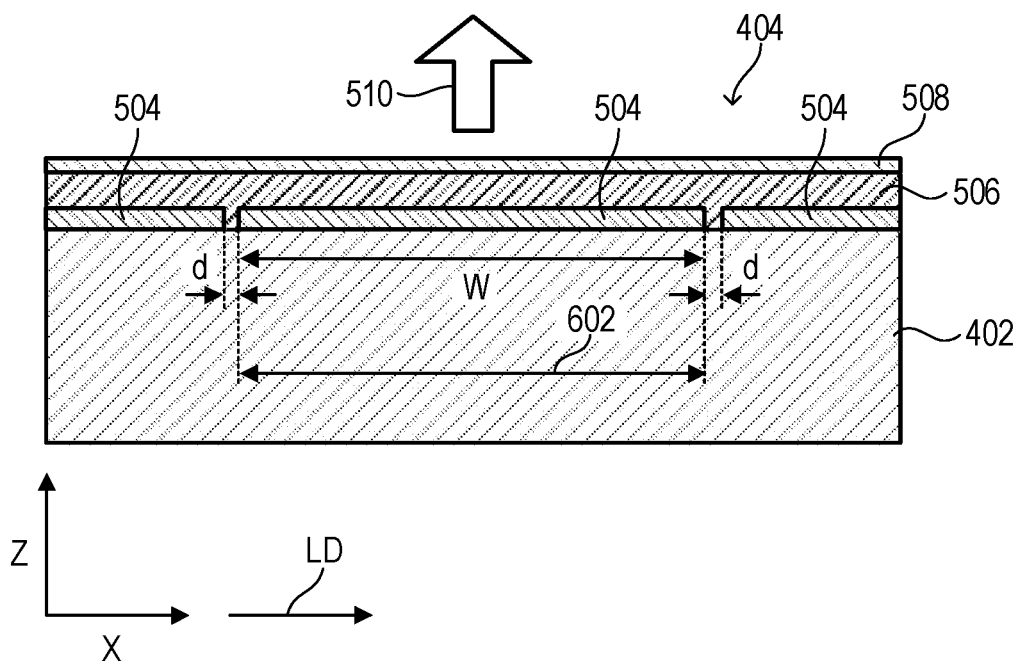
FIG. 5 is a partially enlarged sectional view of a light emitting area taken along the line V-V of FIG. 4.

Next, with reference to FIG. 5, the light emitting area 404 is described. FIG. 5 is a partially enlarged sectional view of the light emitting area 404 taken along the line V-V of FIG. 4. In FIG. 5, the light emitting portion 602 formed in a part of the light emitting area 404 is illustrated. A plurality of lower electrodes 504 are formed on the light emitting circuit board 402. A light-emitting layer 506 is formed on the plurality of lower electrodes 504 formed on the light emitting circuit board 402. An upper electrode 508 is formed on the light-emitting layer 506. The lower electrodes 504 are independent electrodes. The upper electrode 508 is a common electrode. As illustrated in FIG. 5, the lower electrode 504 has a width W in an X direction parallel to the longitudinal direction LD of the light emitting element array chip 400. In the light emitting area 404, 748 lower electrodes 504 are formed in the X direction at an interval "d". As a result, 748 light emitting portions 602 are formed in the light emitting area 404.

The lower electrodes 504 are formed through an Si process together with formation of the circuit portion 406 (not shown in FIG. 5), and are connected to a drive unit (not shown) of the circuit portion 406. A process rule for forming the lower electrodes 504 by the Si process is about 0.2 μm, which is highly accurate, and hence the lower electrodes 504 are arranged with high accuracy at a high density. As described later, a light emitting area of the light emitting portion 602 is substantially the same as the lower electrode 504, thereby being capable of arranging the light emitting portions 602 at a high density. It is preferred that the lower electrodes 504 be made of metal such as silver (Ag), aluminum (Al), or an alloy thereof having high reflectance with respect to an emission wavelength of the light-emitting layer 506.

After the lower electrodes 504 are formed on the light emitting circuit board 402, the light-emitting layer 506 is formed on the lower electrodes 504. The light-emitting layer 506 may be formed continuously, or formed so as to be divided to a size substantially equal to that of the lower electrode 504. As the light-emitting layer 506, for example, an organic EL film can be used. When the organic EL film is used as the light-emitting layer 506, the light-emitting layer 506 may be a laminated structural body including functional layers such as an electron-transporting layer, a hole transporting layer, an electron-injecting layer, a hole injection layer, an electron blocking layer, and a hole blocking layer as needed. Further, as the light-emitting layer 506, an inorganic EL film other than the organic EL film may be used.

After the light-emitting layer 506 is formed on the lower electrodes 504, the upper electrode 508 is formed on the light-emitting layer 506. The upper electrode 508 is electrically connected to the circuit portion 406. It is preferred that the upper electrode 508 be made of a material that is transparent to the emission wavelength of the light-emitting layer 506. As the upper electrode 508, a transparent electrode such as indium tin oxide (ITO) may be used. It is preferred that at least a portion of the upper electrode 508 which corresponds to the lower electrode 504 be made of a material that is transparent to the emission wavelength of the light-emitting layer 506.

Next, a light emitting operation of the light emitting portion 602 formed in the light emitting area 404 is described. First, a voltage is applied by the drive unit (not shown) of the circuit portion 406 to the lower electrode 504 selected by the circuit portion 406. The upper electrode 508 and the light-emitting layer 506 have a common structure with respect to the plurality of lower electrodes 504. A voltage is applied to the light-emitting layer 506 in an area limited by the shape of the lower electrode 504. Thus, a range in which the light-emitting layer 506 generates light is limited to only an upper surface of the selected lower electrode 504. For example, a voltage is applied between the upper electrode 508 and the optionally-selected lower electrode 504 so that a range of the light-emitting layer 506 between the upper electrode 508 and the optionally-selected lower electrode 504 emits light as the light emitting portion 602. The light directed downward among the light generated by the light-emitting layer 506 is reflected by the lower electrode 504 to be directed upward. The light directed upward is emitted to the outside of the light emitting area 404 as emission light 510 via the upper electrode 508 that is transparent.

With use of the transparent electrode such as indium tin oxide (ITO) as the upper electrode 508, an opening ratio of substantially 100% can be obtained. That is, the light generated by the light-emitting layer 506 serves as the emission light 510 as it is. Further, as described above, the lower electrodes 504 are formed through a highly accurate Si process so that the plurality of lower electrodes 504 can be arranged at a high density. Thus, most of the area of the light emitting area 404 can be caused to emit light, thereby being capable of improving the utilization efficiency of the area of the light emitting area 404. Here, the area of the light emitting area 404 is defined as a sum of the total area of the plurality of lower electrodes 504 and the total area of the intervals "d" at which the lower electrodes 504 adjacent to each other are apart from each other. In the embodiment, the shape of the light emitting portion 602 is the same as the shape of the lower electrode 504.

(Bonding Method)

Figure 6A:
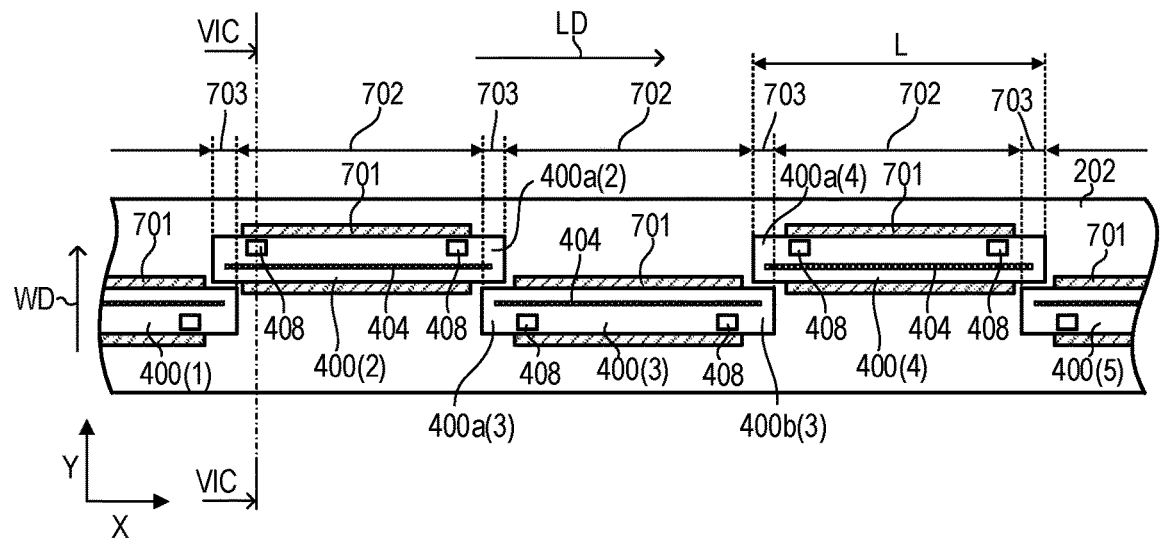
FIG. 6A is a partial plan view for illustrating a positional relationship of the light emitting element array chips arranged in a staggered manner.
Figure 6B:
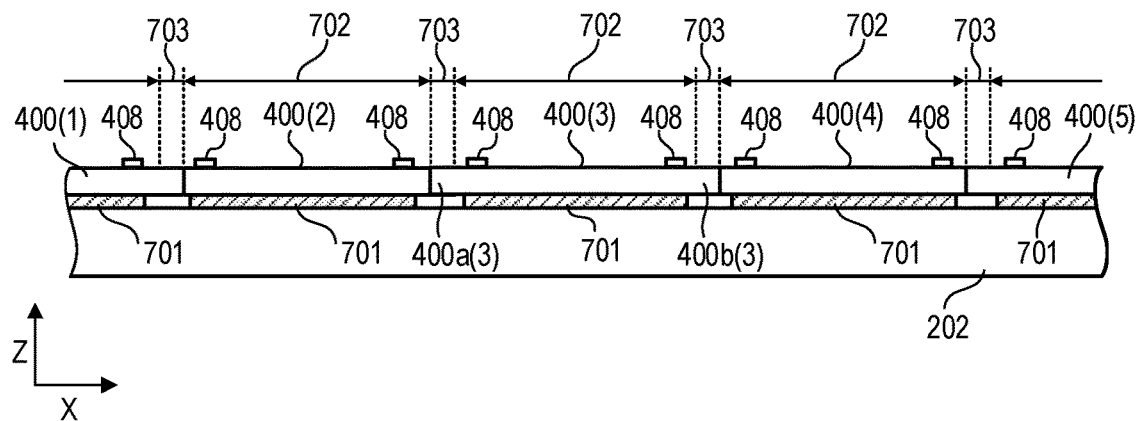
FIG. 6B is a partial side view for illustrating the positional relationship of the light emitting element array chips arranged in the staggered manner.
Figure 6C:
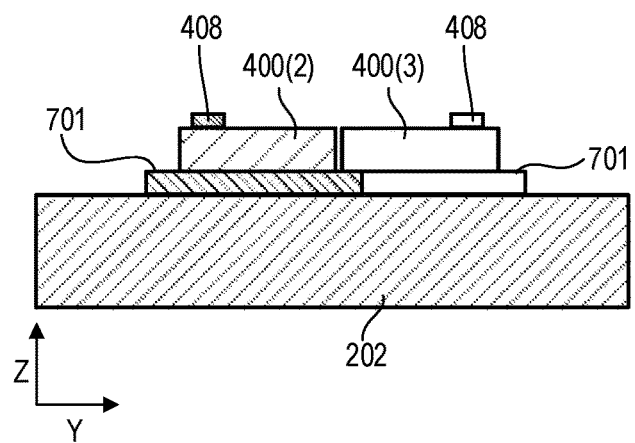
FIG. 6C is a sectional view of the light emitting element array chips taken along the line VIC-VIC of FIG. 6A.

Next, with reference to FIG. 6A, FIG. 6B, and FIG. 6C, a bonding method of fixing the light emitting element array chips 400 onto the printed-circuit board 202 with an adhesive 701 is described. FIG. 6A, FIG. 6B, and FIG. 6C are views for illustrating the light emitting element array chips 400 fixed to the printed-circuit board 202 with the adhesive 701. FIG. 6A is a partial plan view for illustrating a positional relationship of the light emitting element array chips 400 arranged in a staggered manner. FIG. 6B is a partial side view for illustrating the positional relationship of the light emitting element array chips 400 arranged in a staggered manner. In the plurality of light emitting element array chips 400, end portions of the adjacent light emitting element array chips 400 overlap each other as viewed along a width direction (short-side direction) WD (Y-axis direction) orthogonal to the longitudinal direction LD. For example, one end portion 400a(2) of one light emitting element array chip (first light emitting element array chip) 400(2) overlaps one end portion 400a(3) of the light emitting element array chip (second light emitting element array chip) 400(3) adjacent to the one light emitting element array chip 400(2) as viewed in the width direction WD. Another end portion 400b(3) of the light emitting element array chip (second light emitting element array chip) 400(3) overlaps one end portion 400a(4) of the light emitting element array chip (third light emitting element array chip) 400(4) adjacent to the light emitting element array chip 400(3) as viewed in the width direction WD.

First, the adhesive 701 is applied on the printed-circuit board 202, and next, the light emitting element array chips 400 are mounted on the adhesive 701. As the application method for the adhesive 701, a printing method or an application method with a dispenser or the like is used. The adhesive 701 is applied in a range in consideration of spread of the adhesive 701 and an arrangement error so as not to be applied to a chip overlapping area 703 of the light emitting element array chips 400 adjacent to each other in the longitudinal direction LD. An application area of the adhesive 701 in the longitudinal direction LD is a wire bonding pad forming area (hereinafter referred to as "WBP forming area") 702. For example, the adhesive 701 for fixing the light emitting element array chip 400(3) onto the printed-circuit board 202 is applied in an area between the one end portion 400a(2) of the light emitting element array chip 400(2) and the one end portion 400a(4) of the light emitting element array chip 400(4) adjacent to the light emitting element array chip 400(3) on both sides.

An application prohibited area in which application of the adhesive 701 is prohibited on the outside of the WBP forming area 702 is the chip overlapping area 703. In the related art, due to creeping up of the adhesive 701 generated between the adjacent light emitting element array chips 400, the positional accuracy of the light emitting element array chips 400 may be deteriorated, or surfaces of the light emitting element array chips 400 may be contaminated by the adhesive 701. In the embodiment, the adhesive application range is set as described above so that the deterioration of the positional accuracy of the light emitting element array chips 400 due to the creeping up of the adhesive 701 can be prevented to reduce the contamination of the surfaces of the light emitting element array chips 400 by the adhesive 701.

Further, in the embodiment, the adhesive 701 for fixing the light emitting element array chip 400(3) onto the printed-circuit board 202 is not in contact with the adhesive 701 for fixing the adjacent light emitting element array chip 400(2) onto the printed-circuit board 202. The adhesive 701 for fixing the light emitting element array chip 400(3) onto the printed-circuit board 202 is not in contact with the adhesive 701 for fixing the adjacent light emitting element array chip 400(4) onto the printed-circuit board 202. It is preferred that the adhesive 701 for fixing the light emitting element array chip 400(3) onto the printed-circuit board 202 is in non-contact with the adjacent light emitting element array chip 400(2) and light emitting element array chip 400(4).

In the embodiment, the wire bonding pads 408 of the light emitting element array chip 400 are included in the WBP forming area 702, and are arranged on a surface (upper surface) of the light emitting element array chip 400 which is opposite to the surface on which the adhesive 701 is applied (lower surface). Accordingly, the adhesive 701 is applied to the lower surface of the light emitting element array chip 400 which corresponds to the wire bonding pads 408. As a result, the lower surfaces of the wire bonding pads 408 are reinforced, and an occurrence probability of breakage of the light emitting element array chip 400 and a bonding connection failure in a wire bonding step can be reduced. Further, when the application area of the adhesive 701 is narrowed, the bonding strength is reduced. In view of this, it is preferred that the WBP forming area 702 is an area of 50% or more of a length L of the light emitting element array chip 400 in the longitudinal direction LD, and, in general, the adhesive 701 is applied in an area of 80% or more of the length L in the longitudinal direction LD also in consideration of the application accuracy.

FIG. 6C is a sectional view of the light emitting element array chips 400 taken along the line VIC-VIC of FIG. 6A. Also in the short-side direction of the light emitting element array chip 400 (Y-axis direction of FIG. 6C), the adhesive 701 is applied to the lower surfaces of portions corresponding to the wire bonding pads 408. With the configuration described above, the application area of the adhesive 701 for fixing the light emitting element array chip 400 to the printed-circuit board 202 can be optimized. With this, the deterioration of the positional accuracy of the light emitting element array chips 400 and the contamination of the chip surface due to the creeping up of the adhesive 701 can be prevented. Further, with the configuration of the adhesive 701, the strength of the light emitting element array chip 400 with respect to an impact applied to the wire bonding pad 408 in the wire bonding step is also improved, and the breakage of the light emitting element array chip 400 or the bonding connection failure can also be prevented.

In the embodiment, as the light emitting portion 602, an organic EL element having an organic EL film is used. The embodiment is effective for the exposure head 106 having a structure in which the light emitting element array chips 400 are fixed to the printed-circuit board 202 with the adhesive 701. However, the embodiment can obtain the same effect in, for example, an exposure head having an inorganic EL or an LED array.

According to the embodiment, contamination of the light emitting element array chip caused by the adhesive and breakage of the light emitting element array chip due to an impact of wire bonding can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure head, comprising:
   a printed-circuit board;
   a plurality of light emitting element array chips; and
   an adhesive for fixing the plurality of light emitting element array chips to the printed-circuit board,
   wherein each of the plurality of light emitting element array chips includes a plurality of light emitting portions and a wire bonding pad,
   wherein the plurality of light emitting element array chips are arranged in a staggered manner in a longitudinal direction of the printed-circuit board,
   wherein one end portion of a first light emitting element array chip among the plurality of light emitting element array chips overlaps one end portion of a second light emitting element array chip adjacent to the first light emitting element array chip when viewed in a width direction orthogonal to the longitudinal direction, and another end portion of the second light emitting element array chip overlaps one end portion of a third light emitting element array chip adjacent to the second light emitting element array chip when viewed in the width direction,
   wherein the adhesive for fixing the second light emitting element array chip to the printed-circuit board is applied in an area between the one end portion of the first light emitting element array chip and the one end portion of the third light emitting element array chip,
   wherein the first light emitting element array chip and the second light emitting element array chip are arranged with a gap of a first length in the width direction,
   wherein, in the width direction, the adhesive for fixing the second light emitting element array chip protrudes, by a second length longer than the first length, out of the second light emitting element array chip beyond an edge of the second light emitting element array chip, and
   wherein a protrusion part of the adhesive for fixing the second light emitting element array chip is provided away from the first light emitting element array chip.

2. The exposure head according to claim 1, wherein the adhesive is prevented from being applied in an area in which the one end portion of the first light emitting element array chip and the one end portion of the second light emitting element array chip overlap each other, and an area in which the another end portion of the second light emitting element array chip and the one end portion of the third light emitting element array chip overlap each other.

3. The exposure head according to claim 1, wherein the wire bonding pad of the second light emitting element array chip is included in an area in which the adhesive is applied in the area between the one end portion of the first light emitting element array chip and the one end portion of the third light emitting element array chip, and is arranged on a surface of the second light emitting element array chip which is opposite to a surface to which the adhesive is applied.

4. The exposure head according to claim 1, wherein each of the plurality of light emitting element array chips includes a control circuit configured to control the plurality of light emitting portions.

5. The exposure head according to claim 1, wherein each of the plurality of light emitting portions includes a lower electrode, a light-emitting layer, and an upper electrode, and
   wherein at least a portion of the upper electrode which corresponds to the lower electrode is transparent.

6. The exposure head according to claim 1, wherein each of the plurality of light emitting portions is an organic EL.

7. The exposure head according to claim 1, wherein each of the plurality of light emitting portions is an inorganic EL.

8. The exposure head according to claim 1, wherein the wire bonding pad is electrically connected to the printed-circuit board by a metal wire.

9. The exposure head according to claim 1, wherein the adhesive for fixing the second light emitting element array chip to the printed-circuit board is out of contact with the adhesive for fixing the first light emitting element array chip to the printed-circuit board and the adhesive for fixing the third light emitting element array chip to the printed-circuit board.

10. The exposure head according to claim 1, wherein the adhesive for fixing the second light emitting element array chip to the printed-circuit board is out of contact with the first light emitting element array chip and the third light emitting element array chip.

11. An image forming apparatus, comprising:
    a photosensitive drum;
    a charger configured to uniformly charge a surface of the photosensitive drum;
    the exposure head according to claim 1, configured to expose the surface of the photosensitive drum in accordance with an image signal to form an electrostatic latent image;
    a developing device configured to develop the electrostatic latent image with toner to form a toner image;
    a transfer device configured to transfer the toner image onto a recording medium; and
    a fixing device configured to heat and pressurize the toner image to fix the toner image to the recording medium.

* * * * *